(12) United States Patent
Lo et al.

(10) Patent No.: US 12,079,709 B2
(45) Date of Patent: Sep. 3, 2024

(54) NEUROMORPHIC SYSTEM AND METHODOLOGY FOR SWITCHING BETWEEN FUNCTIONAL OPERATIONS

(71) Applicant: NATIONAL TSING HUA UNIVERSITY, Hsinchu (TW)

(72) Inventors: Chung-Chuan Lo, Hsinchu (TW); Alexander James White, Hsinchu (TW); Pei-Hsien Liu, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 988 days.

(21) Appl. No.: 17/076,783

(22) Filed: Oct. 21, 2020

(65) Prior Publication Data
US 2022/0067492 A1 Mar. 3, 2022

(30) Foreign Application Priority Data
Aug. 31, 2020 (TW) ................... 109129785

(51) Int. Cl.
| | | |
|---|---|---|
| G11C 11/54 | (2006.01) | |
| G06N 3/049 | (2023.01) | |
| G06N 3/063 | (2023.01) | |

(52) U.S. Cl.
CPC ............. *G06N 3/063* (2013.01); *G06N 3/049* (2013.01); *G11C 11/54* (2013.01)

(58) Field of Classification Search
CPC ........ G06N 3/063; G06N 3/049; G06N 3/065; G11C 11/54
See application file for complete search history.

(56) References Cited

U.S. PATENT DOCUMENTS

| | | | |
|---|---|---|---|
| 8,564,471 B1 * | 10/2013 | Gao | ................. G04F 10/005 341/166 |
| 9,753,959 B2 | 9/2017 | Birdwell et al. | |

(Continued)

FOREIGN PATENT DOCUMENTS

| | | |
|---|---|---|
| TW | 201543382 A | 11/2015 |
| TW | 201921295 A | 6/2019 |
| TW | 202011281 A | 3/2020 |

OTHER PUBLICATIONS

Arvind Kumar et al., "Spiking activity propagation in neuronal networks: reconciling different perspectives on neural coding", Nature Reviews Neuroscience, published in Sep. 2010, vol. 11, p. 615-627, published by Macmillan Publishers Ltd, United Kingdom.

(Continued)

*Primary Examiner* — Kc Chen
(74) *Attorney, Agent, or Firm* — CKC & Partners Co., LLC

(57) ABSTRACT

A neuromorphic system for switching between a multitude of functional operations includes a controlling unit and a neuron unit. The controlling unit provides a first input and a second input and regulates a multitude of bias currents. The neuron unit receives the bias currents. An input neuron group receives the first input and the second input. An excitatory neuron group is stimulated by the input neuron group. An inhibitory neuron group is electrically connected to the excitatory neuron group, and the inhibitory neuron group and the excitatory neuron group stimulate each other. An output neuron is electrically connected to the excitatory neuron group and stimulated by the excitatory neuron group to generate an output. The bias currents control the excitatory neuron group, the inhibitory neuron group and the output neuron to be in one of a high-activity state, a middle-activity state and a low-activity state.

15 Claims, 17 Drawing Sheets

(56) References Cited

U.S. PATENT DOCUMENTS

| | | | |
|---|---|---|---|
| 2011/0004579 A1* | 1/2011 | Snider | G06N 3/049 |
| | | | 706/26 |
| 2012/0317062 A1* | 12/2012 | Brezzo | G06N 3/063 |
| | | | 706/25 |
| 2015/0278680 A1 | 10/2015 | Annapureddy et al. | |
| 2018/0125319 A1* | 5/2018 | Szatmary | A47L 9/009 |
| 2018/0276530 A1* | 9/2018 | Paul | G06N 3/08 |
| 2020/0160146 A1* | 5/2020 | Oh | H03K 5/2472 |

OTHER PUBLICATIONS

Alexander James White et al., "Multifunctional motifs: robust flexible control of small recurrent networks", Neuroscience 2019—Society of Neuroscience Annual Meeting, dated on Oct. 23, 2019, oral presentation, United States.

Pei-Hsien Liu et al., "Diverse Dynamics in Small Recurrent Networks", Neuroscience 2019—Society of Neuroscience Annual Meeting, dated on Oct. 23, 2019, oral presentation, United States.

* cited by examiner

300d

S120

S130

S140

S140

NEUROMORPHIC SYSTEM AND METHODOLOGY FOR SWITCHING BETWEEN FUNCTIONAL OPERATIONS

RELATED APPLICATIONS

This application claims priority to Taiwan Application Serial Number 109129785, filed Aug. 31, 2020, which is herein incorporated by reference.

BACKGROUND

Technical Field

The present disclosure relates to a neuromorphic system and a neuromorphic methodology. More particularly, the present disclosure relates to a neuromorphic system and a neuromorphic methodology for switching between a multitude of functional operations.

Description of Related Art

In recent years, the demand for large amounts of the data computing has increased with the rise of an artificial intelligence (AI) and an internet of things (IOT). Smart machines will gradually penetrate into daily life. However, the von Neumann bottleneck in conventional computer architecture has become a major problem. When large amounts of data are processed, the data processing and the transmitting speed between a single central processing unit (CPU) and the memory limit the overall efficiency and calculating time, so that it cannot meet the real-time application situation which is required.

A neuromorphic system uses the distributed architecture of neural networks for parallel computing and learning, which can accelerate the calculation speed of the AI. This allows the opportunity to develop a non-cloud AI computing hardware. However, an artificial neural network (ANN) can only perform one specific function at one time. If neural networks are required to perform multi-functional tasks, and the connection strength between the neural networks must be reset. Otherwise the ANN will consume more memory and power during the calculation. In addition, most ANNs are only implemented for identifying or classifying the functions, and the other functional operations still rely on external digital circuits to complete multi-functional tasks. Thus, it is difficult to simplify the system and apply ANNs to tasks which require low power consumption or low budget requirements. In view of the problems listed above, the question becomes how to develop a neural network which can flexibly execute and switch between various unique functions. This is the goal of the public and relevant industry efforts.

SUMMARY

According to an aspect of the present disclosure, a neuromorphic system for switching between a multitude of functional operations includes a controlling unit and a neuron unit. The controlling unit provides a first input and a second input and regulates a multitude of bias currents. The neuron unit is electrically connected to the controlling unit and receives the bias currents. The neuron unit includes an input neuron group, an excitatory neuron group, an inhibitory neuron group and an output neuron. The input neuron group receives the first input and the second input. The excitatory neuron group is electrically connected to the input neuron group and stimulated by the input neuron group. The inhibitory neuron group is electrically connected to the excitatory neuron group, and the inhibitory neuron group and the excitatory neuron group stimulate each other. The output neuron is electrically connected to the excitatory neuron group and stimulated by the excitatory neuron group to generate an output. The bias currents control the excitatory neuron group, the inhibitory neuron group and the output neuron to be in one of a high-activity state, a middle-activity state and a low-activity state.

According to another aspect of the present disclosure, a neuromorphic methodology for switching between the functional operations includes a regulating step, a receiving step, a first stimulating step, a second stimulating step and an outputting step. The regulating step is performed to drive the controlling unit to regulate the bias currents, and the controlling unit includes the first input and the second input. The receiving step is performed to provide the neuron unit to receive the bias currents, and the neuron unit includes the input neuron group, the excitatory neuron group, the inhibitory neuron group and the output neuron, and the input neuron group receives the first input and the second input. The first stimulating step is performed to drive the input neuron group to stimulate the excitatory neuron group. The second stimulating step is performed to drive the excitatory neuron group and the inhibitory neuron group to stimulate each other. The outputting step is performed to drive the excitatory neuron group to stimulate the output neuron to generate the output. The bias currents control the excitatory neuron group, the inhibitory neuron group and the output neuron to be one of in the high-activity state, the middle-activity state and the low-activity state.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiment will be described with the drawings. For clarity, some practical details will be described below. However, it should be noted that the present disclosure should not be limited by the practical details, that is, in some embodiment, the practical details are unnecessary. In addition, for simplifying the drawings, some conventional structures and elements will be simply illustrated, and repeated elements may be represented by the same labels.

It will be understood that when an element (or device) is referred to as be "connected to" another element, it can be directly connected to the other element, or it can be indirectly connected to the other element, that is, intervening elements may be present. In contrast, when an element is referred to as be "directly connected to" another element, there are no intervening elements present. In addition, the terms first, second, third, etc. are used herein to describe various elements or components, these elements or components should not be limited by these terms. Consequently, a first element or component discussed below could be termed a second element or component.

Figure 1:
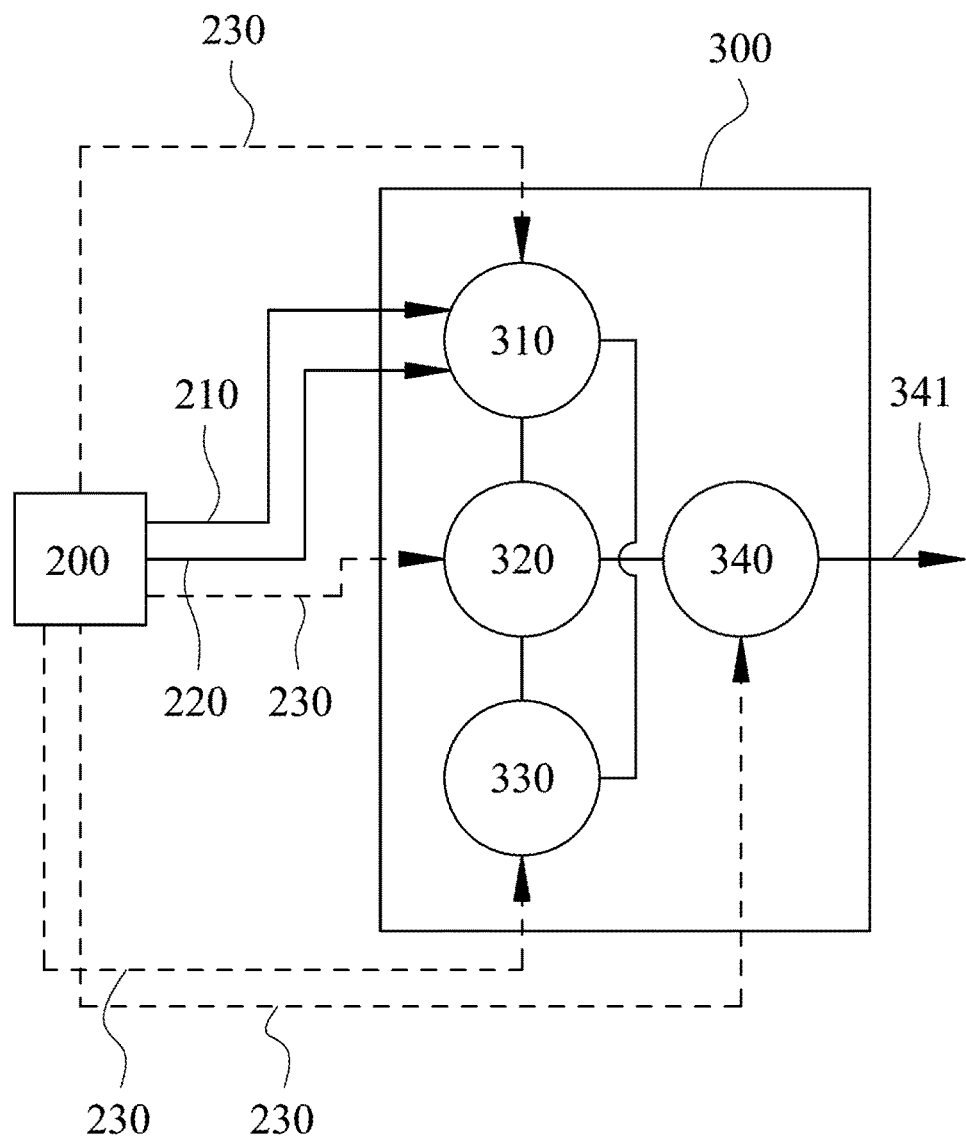
FIG. 1 shows a schematic view of a neuromorphic system for switching between a multitude of functional operations according to an embodiment of a structural aspect of the present disclosure.

FIG. 1 shows a schematic view of a neuromorphic system 100 for switching between a multitude of functional operations according to an embodiment of a structural aspect of the present disclosure. In FIG. 1, the neuromorphic system 100 for switching between the functional operations includes a controlling unit 200 and a neuron unit 300. The controlling unit 200 provides a first input 210 and a second input 220 and regulates a multitude of bias currents 230. The neuron unit 300 is electrically connected to the controlling unit 200 and receives the bias currents 230. The neuron unit 300 includes an input neuron group 310, an excitatory neuron group 320, an inhibitory neuron group 330 and an output neuron 340. The input neuron group 310 receives the first input 210 and the second input 220. The excitatory neuron group 320 is electrically connected to the input neuron group 310 and stimulated by the input neuron group 310. The inhibitory neuron group 330 is electrically connected to the excitatory neuron group 320, and the inhibitory neuron group 330 and the excitatory neuron group 320 stimulate each other. In addition, the inhibitory neuron group 330 can also be connected to the input neuron group 310 and stimulated by the input neuron group 310. The output neuron 340 is electrically connected to the excitatory neuron group 320 and stimulated by the excitatory neuron group 320 to generate an output 341. The bias currents 230 control the excitatory neuron group 320, the inhibitory neuron group 330 and the output neuron 340 to be in one of a high-activity state, a middle-activity state and a low-activity state, respectively. Therefore, the neuromorphic system 100 for switching between the functional operations of the present disclosure regulates each of the bias currents 230 injected into the neuron unit 300 by the control unit 200, so that the neuron unit 300 is quickly switched between the different functional operations so as to save the hardware cost of the neural network computing.

In specific, the neuromorphic system 100 is based on the structure of the biological neural network, the signal transmission and the operating-memory function to carry out the engineering simulation of the electronic circuit components, the circuit simulation, the circuit planning and the computing architecture. The neuromorphic system 100 can include the synapses, the neurons and the spike neural network (SNN). The conventional neuromorphic chips try to simulate the feature of biological neural networks which are highly flexible. In fact, the flexible feature is achieved by changing the connecting strengths between neurons with learning algorithms. The connecting strength is the synaptic weights, but the change of the connecting strengths needs to use additional electronic circuits and consumes time and memory. The neuromorphic system 100 for switching between the functional operations of the present disclosure can be a calculating unit of the neuromorphic chip, and uses the fact that the SNN is close to the cusp bifurcation described mathematically by bifurcation theory, so that the user can use the bias currents 230 injected into the neuron unit 300 by the control unit 200 to change the bifurcations of the SNN so as to perform the multiple functions within the same circuit. In addition, the neuromorphic system 100 for switching between the functional operations can also switch between the bistable state, toggling, or central pattern generation (CPG). The following will describe in detail various embodiments of the neuromorphic system 100 for switching between the functional operations. In the embodiments, a value is outputted after two values are inputted. The neuron unit 300 can quickly switch between various logic gates by adjusting the bias currents 230 injected into the neuron unit 300, and the logic gates can judge the relative magnitude or the relative timing of the input values. The present disclosure includes 8 types of the logic gates, but the present disclosure is not limited thereto.

Figure 2:
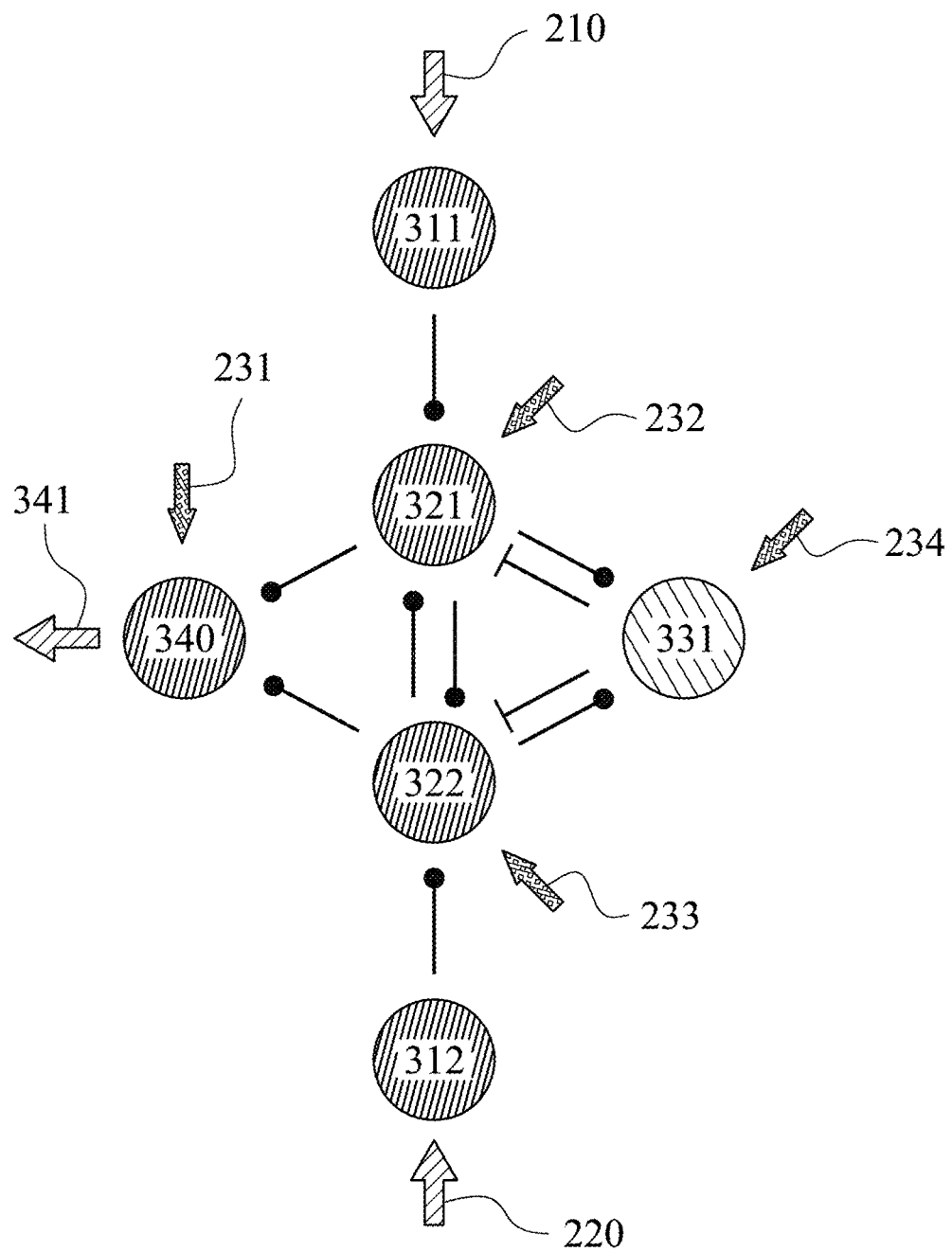
FIG. 2 shows a schematic view of a neuron unit of a 1st embodiment of the neuromorphic system for switching between the functional operations of FIG. 1.

Please refer to FIGS. 1 and 2. FIG. 2 shows a schematic view of the neuron unit 300a of a 1st embodiment of the neuromorphic system 100 for switching between the functional operations of FIG. 1. In FIGS. 1 and 2, a voltage difference from two input neurons of the input neuron group 310, a timing difference between signal input and a phase difference from periodic inputs are generated between the first input 210 and the second input 220, and the first input 210 and the second input 220 are determined to be 0 or 1 according to one of the voltage difference, the timing difference and the phase difference. In detail, the first input 210 and the second input 220 provided from the control unit 200 to the neuron unit 300a is not an absolute voltage value (or an absolute current value) but determined by the magnitude value of a relative voltage (or a relative current). Likewise, a difference in the timing of the arrival of two inputs or their phase offset if the inputs are periodically oscillating can also be used to determine whether the first input 210 and the second input 220 are 0 or 1. Moreover, the output neuron 340 can be controlled by a first bias current 231 of the bias currents 230 to be in one of the high-activity state, the middle-activity state and a low-activity state, and the output 341 of the output neuron 340 is 0 or 1. When the output neuron 340 generates a voltage pulse, the output 341 is 1; when the output neuron 340 does not generate the voltage pulse, the output 341 is 0.

In the 1st embodiment of FIG. 2, the input neuron group 310 includes a first input neuron 311 and a second input neuron 312. The first input neuron 311 is electrically connected to the controlling unit 200. The first input neuron 311 can be in either the high-activity state or the low-activity state according to the first input 210. Likewise, the second input neuron 312 is electrically connected to the controlling unit 200 and is in either the high-activity state or the low-activity state according to the second input 220. The excitatory neuron group 320 includes a first excitatory neuron 321 and a second excitatory neuron 322. The first excitatory neuron 321 is electrically connected to the first input neuron 311 and controlled to be in one of the high-activity state, the middle-activity state and a low-activity state according to a second bias current 232 of the bias currents 230. The first input neuron 311 stimulates the first excitatory neuron 321 according to the first input 210 to switch the first excitatory neuron 321 to be in one of the high-activity state, the middle-activity state and a low-activity state. The second excitatory neuron 322 is electrically connected to the second input neuron 312 and controlled to be in one of the high-activity state, the middle-activity state and a low-activity state according to a third bias current 233 of the bias currents 230. Moreover, the second input neuron 312 stimulates the second excitatory neuron 322 according to the second input 220 to switch the second excitatory neuron 322 to be in one of the high-activity state, the middle-activity state and a low-activity state. The first excitatory neuron 321 and the second excitatory neuron 322 stimulate each other. However, in other embodiments, the first input neuron 311 and the second input neuron 312 can also be the electronic circuit components, the oscillators, the pulse generators, or the output neurons of the other neural networks with the pulse signals, but the present disclosure is not limited thereto.

Furthermore, the inhibitory neuron group 330 includes an inhibitory neuron 331. The inhibitory neuron 331 is electrically connected to the first excitatory neuron 321 and the second excitatory neuron 322 and controlled to be in one of the high-activity state, the middle-activity state and a low-activity state according to a fourth bias current 234 of the bias currents 230. The first excitatory neuron 321, the second excitatory neuron 322 and the inhibitory neuron 331 stimulate each other to switch the first excitatory neuron 321 and the second excitatory neuron 322 to be in one of the high-activity state, the middle-activity state and a low-activity state, respectively.

It is worth noting that, the neuron unit 300a can further include a multitude of excitatory connections 350 and a multitude of inhibitory connections 360. A first one of the excitatory connections 350 is electrically connected between the input neuron group 310 and the excitatory neuron group 320. A second one of the excitatory connections 350 is electrically connected between the excitatory neuron group 320 and the inhibitory neuron group 330. A third one of the excitatory connections 350 is electrically connected between the excitatory neuron group 320 and the output neuron 340. Each of the excitatory connections 350 is configured to transmit an exciting signal (not shown). The inhibitory connections 360 are electrically connected between the excitatory neuron group 320 and the inhibitory neuron group 330, and each of the inhibitory connections 360 is configured to transmit an inhibiting signal (not shown). It should be noted that the excitatory connections 350 are configured to simulate an excitatory synapse of the neural network through the electronic circuit components to excite another neuron; similarly, the inhibitory connections 360 are configured to simulate an inhibitory synapse of the neural network through the electronic circuit components to inhibit another neuron.

Please refer to the following Table 1. Table 1 shows a parameter (unit: nA) of each of the bias currents 230 injected into the neuron unit 300 which is regulated by the controlling unit 200, when the neuromorphic system 100 for switching between the functional operations of the present disclosure is an OR gate and an XOR gate. The first input 210 and the second input 220 of the neuromorphic system 100 for switching between the functional operations in Table 1 are determined to be 0 or 1 according to a level of the voltage difference.

TABLE 1

|  | 231 | 232 | 233 | 234 |
|---|---|---|---|---|
| OR | 0 | 0 | 0 | −0.2 |
| XOR | 0 | 0.5 | 0.5 | 0.5 |

In detail, according to the 1st embodiment of FIG. 2, the neuron unit 300a of the neuromorphic system 100 for switching between the functional operations can be the OR gate. The second bias current 232 injected into the first excitatory neuron 321 and the third bias current 233 injected into the second excitatory neuron 322 are 0 nA, so that the first excitatory neuron 321 and the second excitatory neuron 322 can be in a normal excitable state (i.e., the middle-activity state). The fourth bias current 234 injected into the inhibitory neuron 331 is −0.2 nA, so that the inhibitory neuron 331 is in an unexcitable state (i.e., the low-activity state). Then, when the first input 210 and the second input 220 are 1, the first input neuron 311 and the second input neuron 312 are in the high-activity state and stimulate the first excitatory neuron 321 and the second excitatory neuron 322 through the excitatory connections 350, respectively. Then, the first excitatory neuron 321 and the second excitatory neuron 322 excite each other through the excitatory connections 350, so that the first excitatory neuron 321 and the second excitatory neuron 322 are switched from the middle-activity state to the high-activity state.

Next, the inhibitory neuron 331 receives a stimulation (i.e., an excitation) from the first excitatory neuron 321 and another stimulation from the second excitatory neuron 322 at the same time. Because the fourth bias current 234 is negative and injected into the inhibitory neuron 331, the inhibitory neuron 331 is in the low-activity state. The inhibitory neuron 331 with low-activity cannot inhibit the first excitatory neuron 321 and the second excitatory neuron 322 through the inhibitory connections 360. Finally, the first excitatory neuron 321 and the second excitatory neuron 322 are still in the high-activity state and excite the output neuron 340, so that the output 341 generated from the output neuron 340 is 1.

Figure 3:
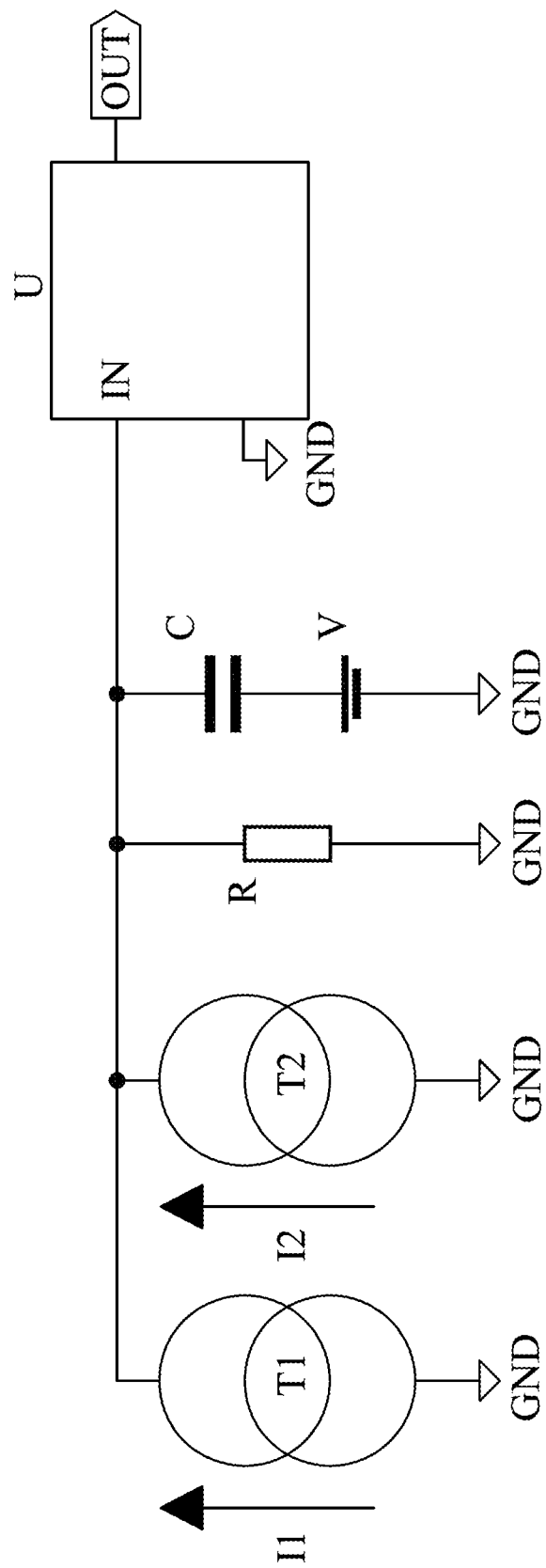
FIG. 3 shows a circuit diagram of each of the neurons of the neuron unit of the 1st embodiment of FIG. 2.
Figure 4:
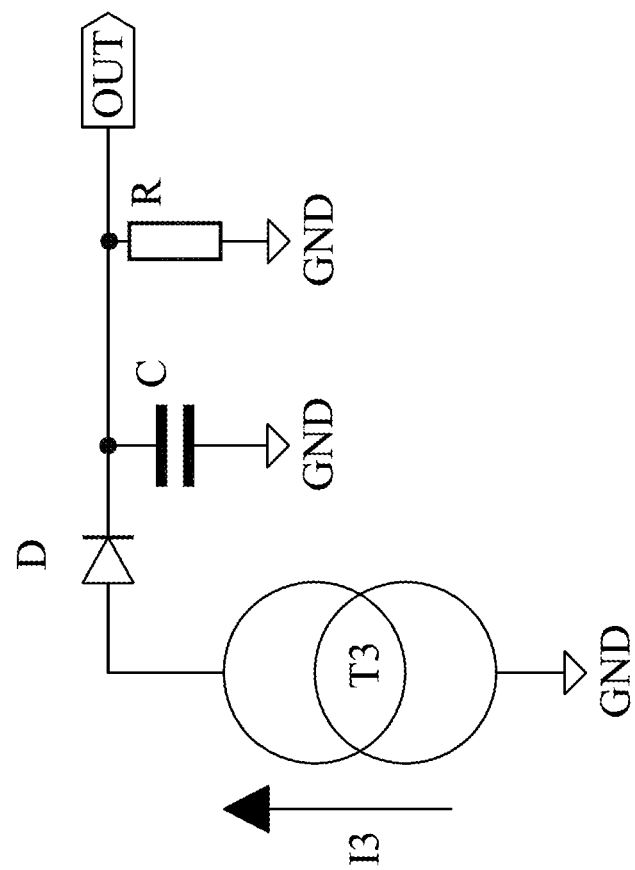
FIG. 4 shows a circuit diagram of one of a multitude of excitatory connections of the neuron unit of the 1st embodiment of FIG. 2.
Figure 5:
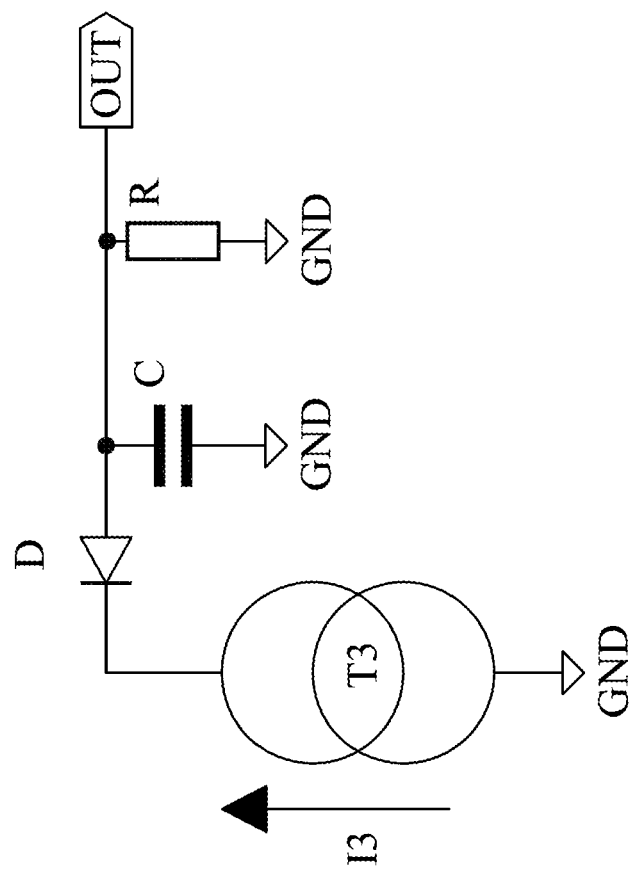
FIG. 5 shows a circuit diagram of one of a multitude of inhibitory connections of the neuron unit of the 1st embodiment of FIG. 2.
Figure 6:
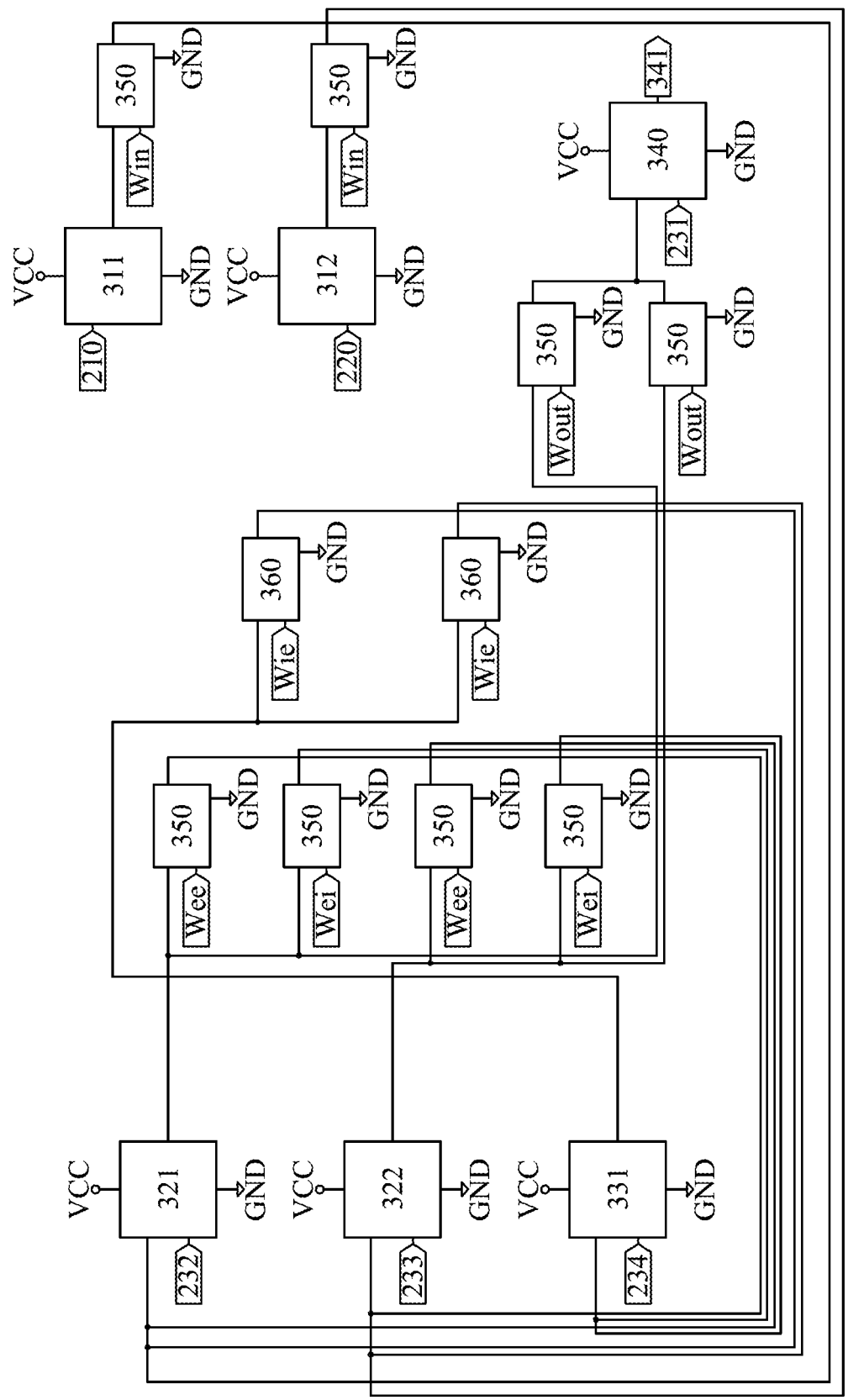
FIG. 6 shows a circuit diagram of the neuron unit of the 1st embodiment of FIG. 2.

Please refer to FIGS. 2 to 6. FIG. 3 shows a circuit diagram of each of the neurons of the neuron unit 300a of the 1st embodiment of FIG. 2. FIG. 4 shows a circuit diagram of one of the excitatory connections 350 of the neuron unit 300a of the 1st embodiment of FIG. 2. FIG. 5 shows a circuit diagram of one of the inhibitory connections 360 of the neuron unit 300a of the 1st embodiment of FIG. 2. FIG. 6 shows a circuit diagram of the neuron unit 300a of the 1st embodiment of FIG. 2. In FIG. 3, each of the neurons can be composed of a voltage threshold detector U (50 mV), two converters T1, T2, a resistor R (25 nΩ), a capacitor C (0.5 nF) and a DC voltage V (70 mV). The voltage threshold detector U has an input end IN, an output end OUT and a ground end GND. When an input voltage of the input end IN exceeds a threshold, a voltage pulse having a short period will be outputted from the output end OUT, and the circuit system of FIG. 3 will be briefly grounded from the ground end GND. The converter T1 and the converter T2 can be a signal converter for converting the voltage pulse into a current. The converter T1 receives the exciting signal of the excitatory connection 350 or the inhibiting signal of the inhibitory connection 360 to generate a current I1. The converter T2 generates another current I2 (that is, the bias current 230), and the circuit diagram of each of the neurons of the present disclosure is not limited thereto. Moreover, in FIGS. 4 and 5, the excitatory connection 350 can include a diode D, a resistor R (250 nΩ), a capacitor C (0.5 nF) and a converter T3. The inhibitory connection 360 can include a diode D, a resistor R (100 nΩ), a capacitor C (0.5 nF) and a converter T3. The converter T3 of the excitatory connection 350 and the converter T3 of the inhibitory connection 360 are configured to receive the voltage pulses generated by the output end OUT of each of the neurons to generate the currents I3, respectively. The output end OUT of the excitatory connection 350 and the output end OUT of the inhibitory connection 360 generate the exciting signal and the inhibiting signal, respectively. Furthermore, in FIG. 6, each of the neurons is electrically connected to a power end VCC having a power voltage, which is configured to be a working voltage of the neuron unit 300a.

Especially, in FIG. 6, each of the neurons of the neuron unit 300a of the neuromorphic system 100 for switching between the functional operations of the present disclosure can be established as a neuron model, which is represented as the following equation (1):

$$C_m \frac{dV_m}{dt} = -\frac{\tau}{C_m}(V_m - E_{leak}) - \sum W_j s_j(t)(V_{in} - E_{syn}). \quad (1)$$

The conditions and the recovery time of each of the neurons are represented as the following equation (2):

$$\text{If } V_M > V_{th}, \text{ then spike and } \frac{dV_m}{dt} = 0 \text{ for } T_{Refractory}. \quad (2)$$

The excitatory connection 350 can be established as an excitatory synapse model, which is represented as the following equation (3); the inhibitory connection 360 can be established as an inhibitory synapse model, which is represented as the following equation (4):

$$\frac{ds}{dt} = \frac{-s}{\tau_{exc}} + \delta(t - t_{spike}); \quad (3)$$

$$\frac{ds}{dt} = \frac{-s}{\tau_{inh}} + \delta(t - t_{spike}). \quad (4)$$

Please refer to the following Table 2 and Table 3 which show a multitude example set of parameters for each of the neurons, the excitatory connection 350 and the inhibitory connection 360 of the neuron unit 300a of the neuromorphic system 100 for switching between the functional operations of the present disclosure. The above equations (1) to (4) and the following parameters are the conventional art of the neural networks, and will not be described in detail herein. The present disclosure is not limited thereto.

TABLE 2

| $C_m$ | T | $V_{th}$ | T Refractory | Eleak |
|---|---|---|---|---|
| 5 nF | 20 ms | −50 mV | 2 ms | −70 mV |

TABLE 3

| $\tau_{exc}$ | $E_{syn}$ (Excitatory Connection) | $\tau_{inh}$ | $E_{syn}$ (Inhibitory Connection) |
|---|---|---|---|
| 2 ms | 0 mV | 5 ms | −90 mV |

Furthermore, in FIG. 6, the excitatory connection 350 and the inhibitory connection 360 of the neuron unit 300a of the neuromorphic system 100 for switching between the functional operations of the present disclosure have a multitude set of stable synaptic weights Wee, Wei, Wie, Win, Wout, which are listed in the following Table 4, but the present disclosure is not limited thereto. An example parameter set for each of the synaptic weights Wee, Wei, Wie, Win, Wout is configured to determine the magnitude of the current I3 of FIG. 4 or FIG. 5.

TABLE 4

| Wee | Wei | Wie | Win | Wout |
|---|---|---|---|---|
| 50 µS | 30 µS | 120 µS | 45 µS | 500 µS |

Figure 7A:
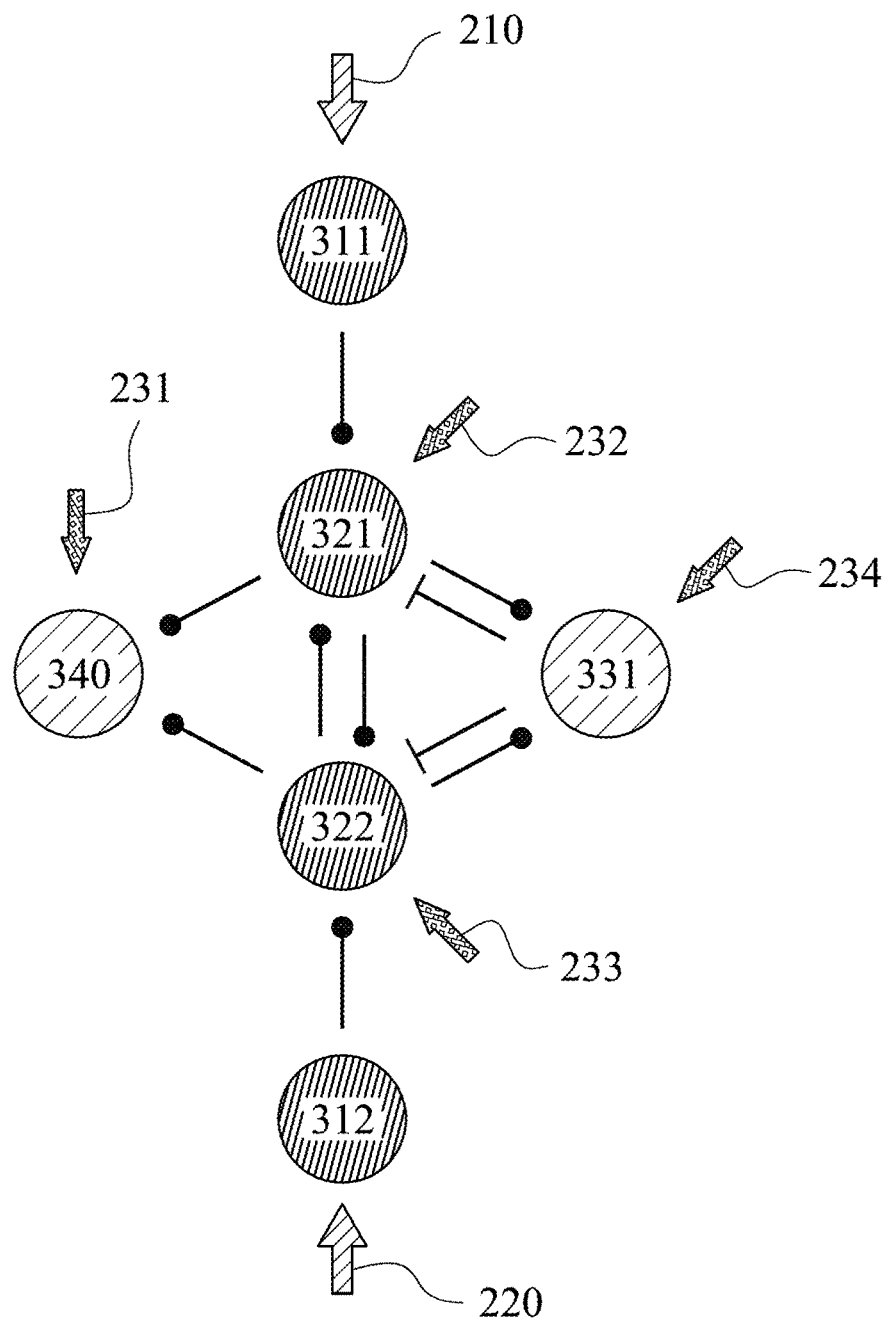
FIG. 7A shows a schematic view of a neuron unit of a 2nd embodiment of the neuromorphic system for switching between the functional operations of FIG. 1.
Figure 7B:
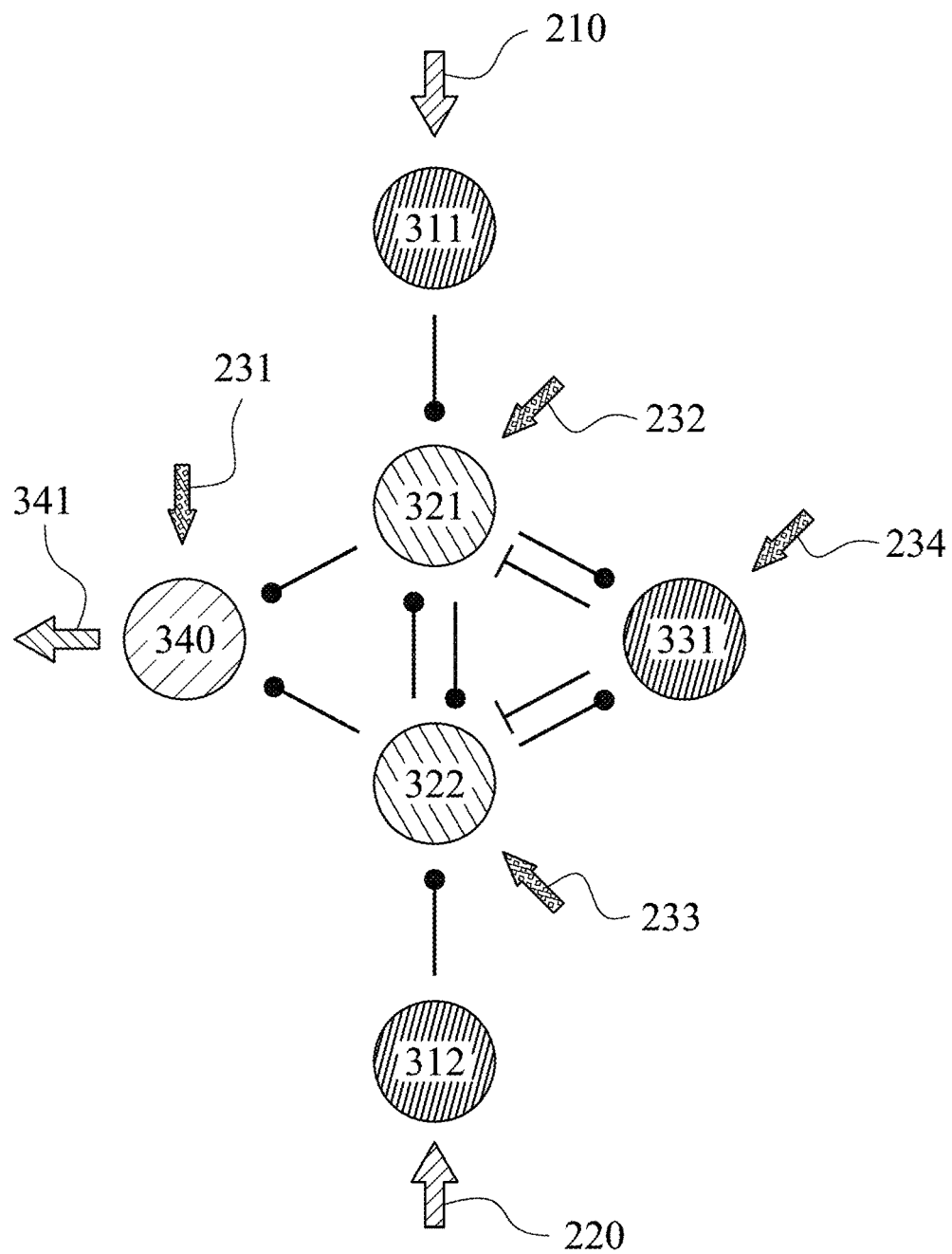
FIG. 7B shows a schematic view of a stimulation between a first excitatory neuron, a second excitatory neuron and an inhibitory neuron of the neuron unit of the 2nd embodiment of FIG. 7A.

Please refer to Table 1, FIGS. 7A and 7B. FIG. 7A shows a schematic view of a neuron unit 300b of a 2nd embodiment of the neuromorphic system 100 for switching between the functional operations of FIG. 1. FIG. 7B shows a schematic view of a stimulation between the first excitatory neuron 321, the second excitatory neuron 322 and the inhibitory neuron 331 of the neuron unit 300b of the 2nd embodiment of FIG. 7A. In detail, according to the 2nd embodiment of FIG. 7A, the neuron unit 300b of the neuromorphic system 100 for switching between the functional operations can be the XOR gate. The second bias current 232 injected into the first excitatory neuron 321, the third bias current 233 injected into the second excitatory neuron 322 and the fourth bias current 234 injected into the inhibitory neuron 331 are 0.5 nA, so that the first excitatory neuron 321, the second excitatory neuron 322 and the inhibitory neuron 331 can be in a highly excitable state (i.e., the high-activity state). Then, when the first input 210 and the second input 220 are 1, the first input neuron 311 and the second input neuron 312 are in the high-activity state and stimulate the first excitatory neuron 321 and the second excitatory neuron 322 through the excitatory connections 350, respectively. Then, the first excitatory neuron 321 and the second excitatory neuron 322 excite each other through the excitatory connections 350, so that the first excitatory neuron 321 and the second excitatory neuron 322 are switched from the high-activity state to a super high-activity state.

And then, in FIG. 7B, the inhibitory neuron 331 receives a stimulation (i.e., an excitation) from the first excitatory neuron 321 and another stimulation from the second excitatory neuron 322 at the same time. Because the fourth bias current 234 is positive and injected into the inhibitory neuron 331, the inhibitory neuron 331 is in the high-activity state. The inhibitory neuron 331 with the high-activity state can inhibit the first excitatory neuron 321 and the second excitatory neuron 322 through the inhibitory connections 360 so as to change the first excitatory neuron 321 and the second excitatory neuron 322 from the super high-activity state to the low-activity state, so the output neuron 340 cannot be excited, so that the output 341 generated by the output neuron 340 is zero. It is worth noting that each of the neuron units 300a, 300b has 6 neurons in the 1st embodiment and the 2nd embodiment, but the following will describe an embodiment in which each of the neuron units 300c, 300d has 7 neurons.

Figure 8:
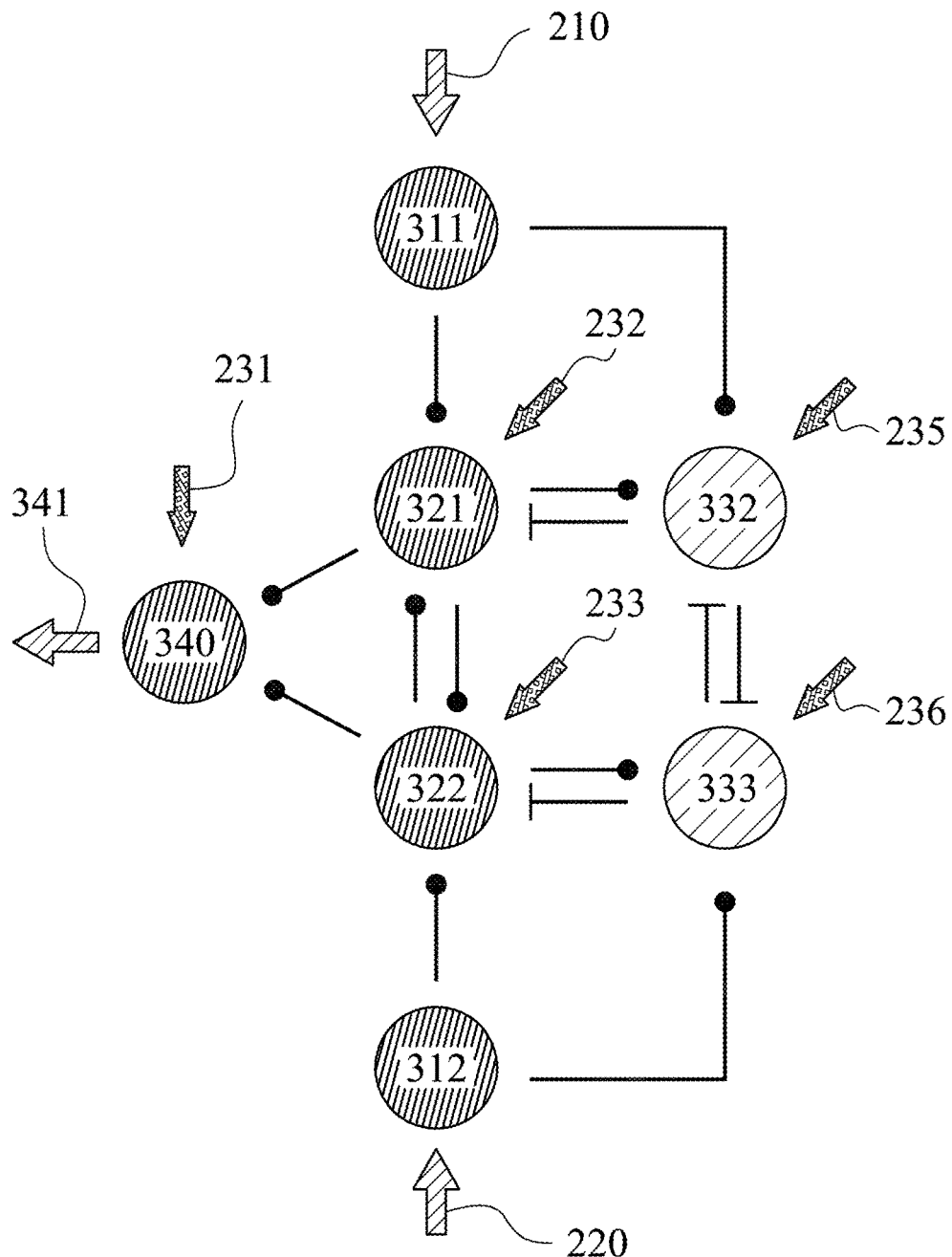
FIG. 8 shows a schematic view of a neuron unit of a 3rd embodiment of the neuromorphic system for switching between the functional operations of FIG. 1.
Figure 9:
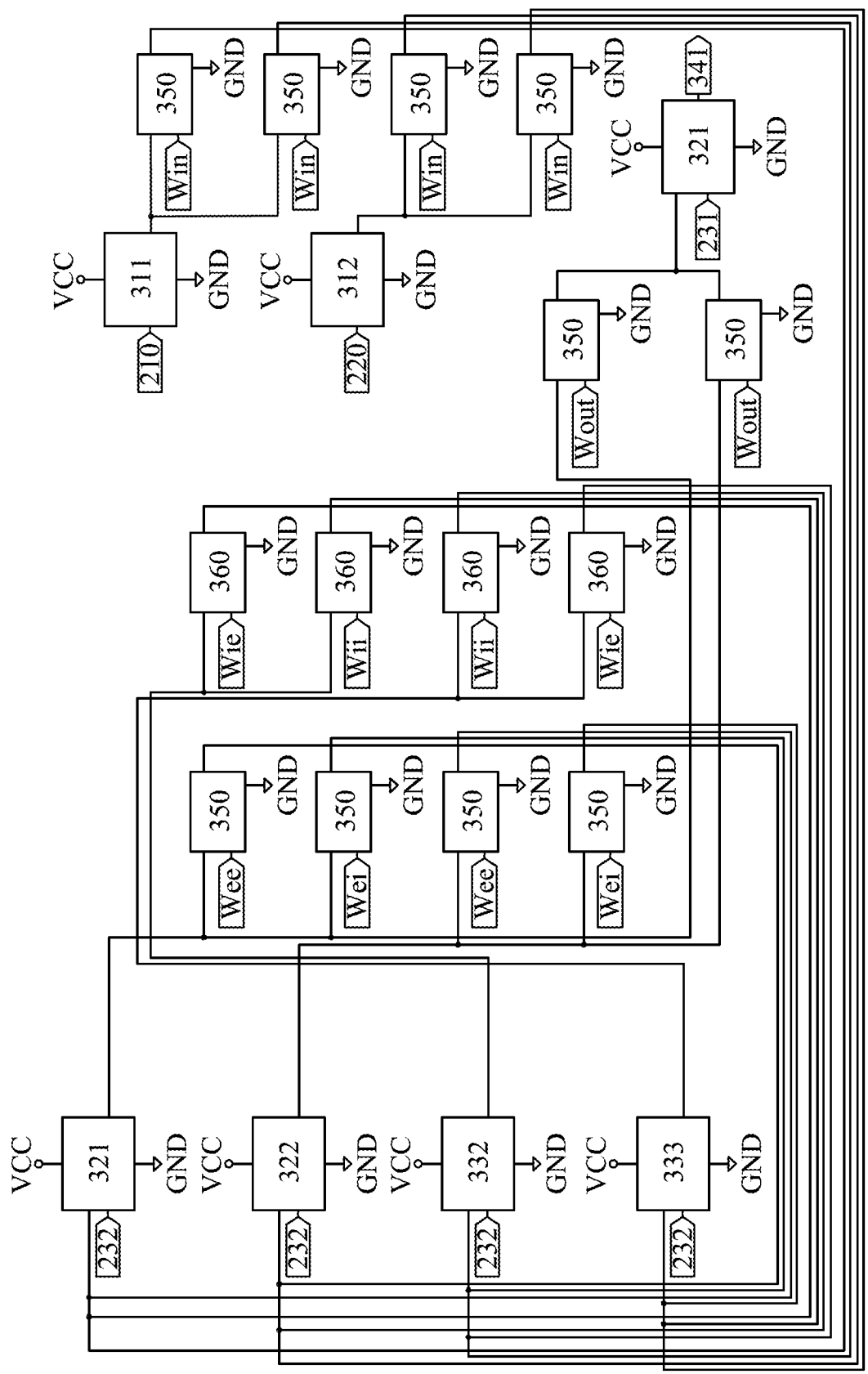
FIG. 9 shows a circuit diagram of the neuron unit of the 3rd embodiment of FIG. 8.

Please refer to FIGS. 1 and 8-9. FIG. 8 shows a schematic view of a neuron unit 300c of a 3rd embodiment of the neuromorphic system 100 for switching between the functional operations of FIG. 1. FIG. 9 shows a circuit diagram of the neuron unit 300c of the 3rd embodiment of FIG. 8. In the 3rd embodiment of FIG. 8, the inhibitory neuron group 330 can include a first inhibitory neuron 332 and a second inhibitory neuron 333. The first inhibitory neuron 332 is electrically connected to the first excitatory neuron 321 and the first input neuron 311 and controlled to be in one of the high-activity state, the middle-activity state and a low-activity state according to a fifth bias current 235 of the bias currents 230. The first input neuron 311 stimulates the first inhibitory neuron 332 according to the first input 210, and the first excitatory neuron 321 and the first inhibitory neuron 332 stimulate each other to switch the first excitatory neuron 321 to be in one of the high-activity state, the middle-activity state and a low-activity state.

Further, the second inhibitory neuron 333 is electrically connected to the second excitatory neuron 322 and the second input neuron 312 and controlled to be in one of a high-activity state, a middle-activity state and a low-activity state according to a sixth bias current 236 of the bias currents 230. The second input neuron 312 stimulates the second inhibitory neuron 333 according to the second input 220, and the second excitatory neuron 322 and the second inhibitory neuron stimulate 333 each other to switch the second excitatory neuron 322 to be in one of the high-activity state, the middle-activity state and a low-activity state. The first inhibitory neuron 332 and the second inhibitory neuron 333 stimulate each other. Furthermore, the neuron unit 300c can further include a multitude of excitatory connections 350 and a multitude of inhibitory connections 360 which are similar to the arrangement of the excitatory connections 350 and the inhibitory connections 360 of the neuron unit 300a in the 1st embodiment of FIG. 2, and will not be described in detail herein.

Please refer to the following Table 5. Table 5 shows the parameters (unit: nA) of each of the bias currents 230 injected into the neuron unit 300 which is regulated by the controlling unit 200, when the neuromorphic system 100 for switching between the 8 different logic gates of the present disclosure. The first input 210 and the second input 220 of the neuromorphic system 100 for switching between the functional operations in Table 5 are determined to be 0 or 1 according to a level of the voltage difference.

TABLE 5

|      | 231 | 232   | 233   | 235  | 236  |
|------|-----|-------|-------|------|------|
| AND  | 0   | 0     | 0     | −0.2 | −0.2 |
| IMP  | 0   | 1     | 0.7   | 0.8  | 1    |
| NAND | 0   | 0.7   | 0.7   | 0.4  | 0.4  |
| NIMP | 0   | 0.2   | 0     | 0.85 | 0.85 |
| NOR  | 0   | 0.7   | 0.7   | 2    | 2    |
| NXOR | 0   | 1.2   | 1.2   | 1.1  | 1.1  |
| OR   | 0   | 0     | 0     | 0    | 0    |
| XOR  | 0   | −0.45 | −0.45 | 0    | 0    |

In detail, according to the 3rd embodiment of FIG. 8, the neuron unit 300c of the neuromorphic system 100 for switching between the functional operations can be such as an AND gate for example. The second bias current 232 injected into the first excitatory neuron 321 and the third bias current 233 injected into the second excitatory neuron 322 are 0 nA, so that the first excitatory neuron 321 and the second excitatory neuron 322 can be in a normal excitable state (i.e., the middle-activity state). The fifth bias current 235 injected into the first inhibitory neuron 332 and the sixth bias current 236 injected into the second inhibitory neuron 333 are −0.2 nA, so that the first inhibitory neuron 332 and the second inhibitory neuron 333 are in an unexcitable state (i.e., the low-activity state). Then, when the first input 210 and the second input 220 are 1, the first input neuron 311 and the second input neuron 312 are in the high-activity state and stimulate the first excitatory neuron 321 and the second excitatory neuron 322 through the excitatory connections 350, respectively. Then, the first excitatory neuron 321 and the second excitatory neuron 322 excite each other through the excitatory connections 350, so that the first excitatory neuron 321 and the second excitatory neuron 322 are switched from the middle-activity state to the high-activity state.

And then, the first inhibitory neuron 332 receives a stimulation (i.e., an excitation) from the first input neuron 311 and another stimulation from the first excitatory neuron 321 at the same time; the second inhibitory neuron 333 also receives a stimulation from the second input neuron 312 and another stimulation from the second excitatory neuron 322 at the same time. Because the fifth bias current 235 and the sixth bias current 236 are negative and are injected into the first inhibitory neuron 332 and the second inhibitory neuron 333, respectively, the first inhibitory neuron 332 and the second inhibitory neuron 333 is in the low-activity state. The first inhibitory neuron 332 and the second inhibitory neuron 333 stimulate each other (i.e., an inhibition) through the inhibitory connections 360, so that the first inhibitory neuron 332 and the second inhibitory neuron 333 with low-activity cannot inhibit the first excitatory neuron 321 and the second excitatory neuron 322 through the inhibitory connections 360, respectively. Finally, the first excitatory neuron 321 and the second excitatory neuron 322 are still in the high-activity state and excite the output neuron 340, so that the output 341 generated from the output neuron 340 is 1.

Furthermore, in FIG. 9, each of the neurons of the neuron unit 300c of the neuromorphic system 100 for switching between the functional operations of the present disclosure can be established as a neuron model which is the same as each of the neurons of the neuron unit 300a of FIG. 6, and will not be described in detail herein.

Moreover, in FIG. 9, the excitatory connection 350 and the inhibitory connection 360 of the neuron unit 300c of the neuromorphic system 100 for switching between the functional operations of the present disclosure have a multitude set of example synaptic weights Wee, Wei, Wie, Wii, Win, Wout listed in the following Table 6, but the present disclosure is not limited thereto.

TABLE 6

| Wee | Wei | Wie | Wii | Win | Wout |
|---|---|---|---|---|---|
| 50 μS | 30 μS | 60 μS | 30 μS | 45 μS | 50 μS |

Figure 10A:
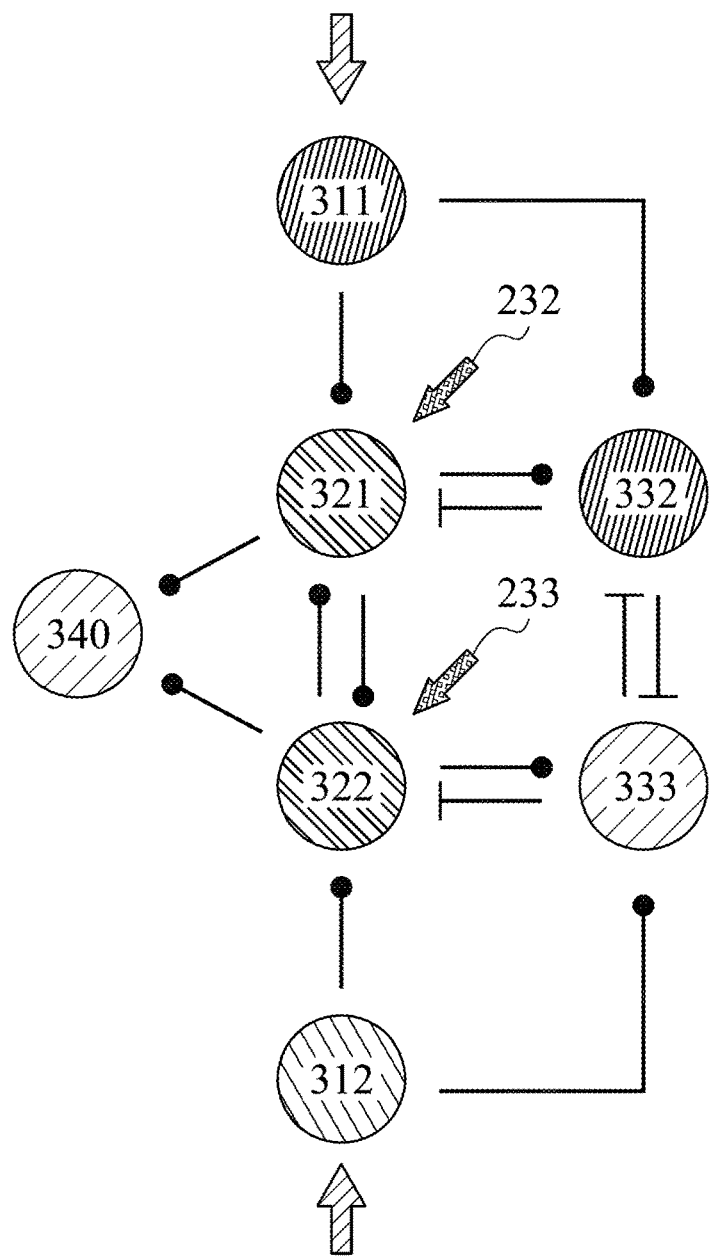
FIG. 10A shows a schematic view of a neuron unit of a 4th embodiment of the neuromorphic system for switching between the functional operations of FIG. 1.
Figure 10B:
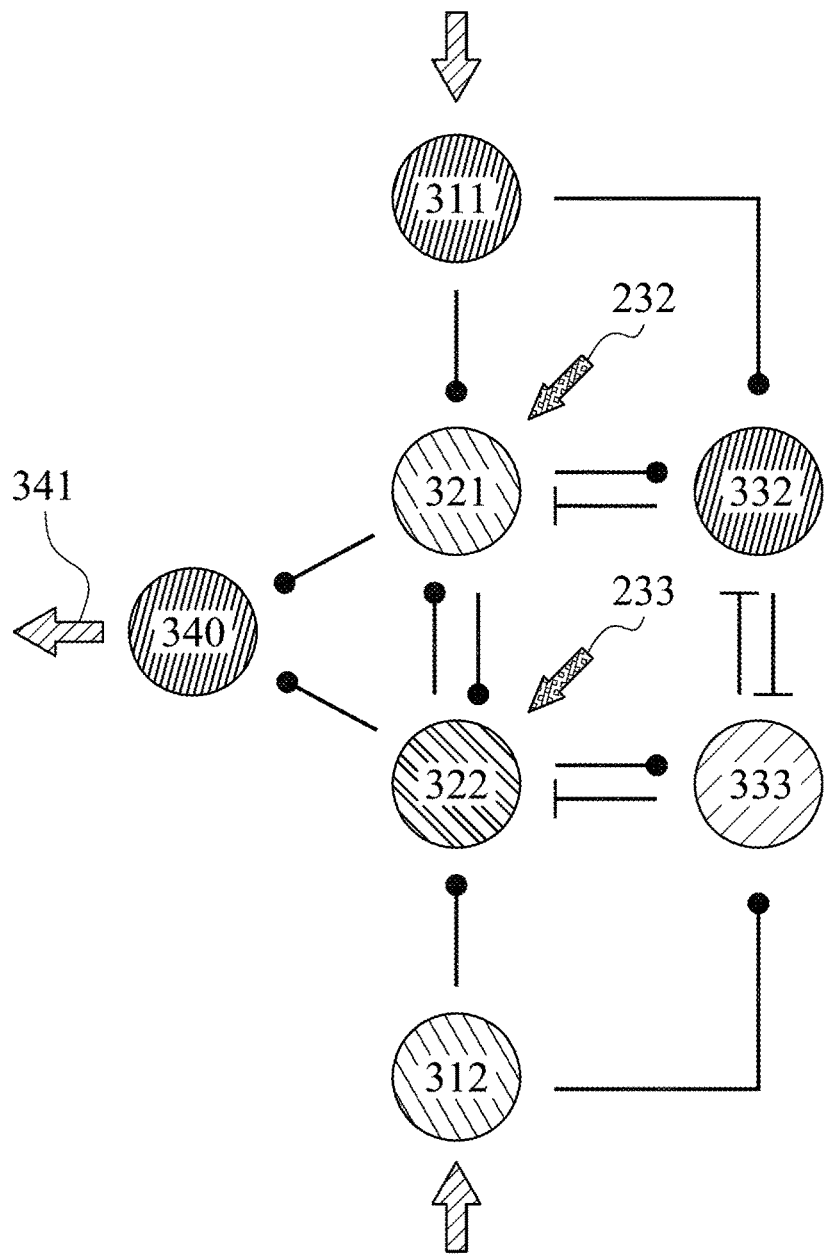
FIG. 10B shows a schematic view of a stimulation between the first excitatory neuron, the second excitatory neuron and the inhibitory neuron of the neuron unit of the 4th embodiment of FIG. 10A.

Please refer to Table 5, FIGS. 10A and 10B. FIG. 10A shows a schematic view of a neuron unit 300d of a 4th embodiment of the neuromorphic system 100 for switching between the functional operations of FIG. 1. FIG. 10B shows a schematic view of a stimulation between the first excitatory neuron 321, the second excitatory neuron 322, the first inhibitory neuron 332 and the second inhibitory neuron 333 of the neuron unit 300d of the 4th embodiment of FIG. 10A. In detail, according to the 4th embodiment of FIG. 10A, the neuron unit 300d of the neuromorphic system 100 for switching between the functional operations can be the XOR gate. The second bias current 232 injected into the first excitatory neuron 321 and the third bias current 233 injected into the second excitatory neuron 322 are −0.45 nA, so that the first excitatory neuron 321 and the second excitatory neuron 322 are in an unexcitable state (i.e., the low-activity state).

Then, in the 4th embodiment, both of the first input 210 and the second input 220 have a current. The lower is 0, and the higher is 1 in the currents. When the first input 210 is 1 and the second input 220 is 0, an activity of the first input neuron 311 is greater than an activity of the second input neuron 312, and the first input neuron 311 and the second input neuron 312 stimulate the first excitatory neuron 321 and the second excitatory neuron 322 through the excitatory connections 350, respectively. Because the second bias current 232 and the third bias current 233 are negative and injected into the first excitatory neuron 321 and the second excitatory neuron 322, the first excitatory neuron 321 and the second excitatory neuron 322 are in the low-activity state. Then, the first excitatory neuron 321 and the second excitatory neuron 322 excite each other through the excitatory connections 350, so that the first excitatory neuron 321 and the second excitatory neuron 322 are switched from the low-activity state to the middle-activity state.

And then, in FIG. 10B, the first inhibitory neuron 332 receives a stimulation (i.e., an excitation) from the first input neuron 311 and another stimulation from the first excitatory neuron 321 at the same time; the second inhibitory neuron 333 also receives a stimulation from the second input neuron 312 and another stimulation from the second excitatory neuron 322 at the same time. Because the activity of the first input neuron 311 is greater than the activity of the second input neuron 312, an activity of the first inhibitory neuron 332 is greater than an activity of the second inhibitory neuron 333. The first inhibitory neuron 332 with high-activity inhibits the second inhibitory neuron 333 with low-activity, so that the first inhibitory neuron 332 with high-activity inhibits the first excitatory neuron 321. The first excitatory neuron 321 is switched from the middle-activity state to the low-activity state. Further, the second inhibitory neuron 333 with low-activity cannot inhibit the second excitatory neuron 322, and the second excitatory neuron 322 is still in the middle-activity state.

Finally, the first excitatory neuron 321 with low-activity and the second excitatory neuron 322 with middle-activity can still excite the output neuron 340, so that the output 341 generated from the output neuron 340 is 1. Therefore, it is favorable for switching the pulsed neural network between the multiple functions or the logic gates by regulating the currents injected into each of the neurons so as to save resource consumption in the calculating process.

Figure 11:
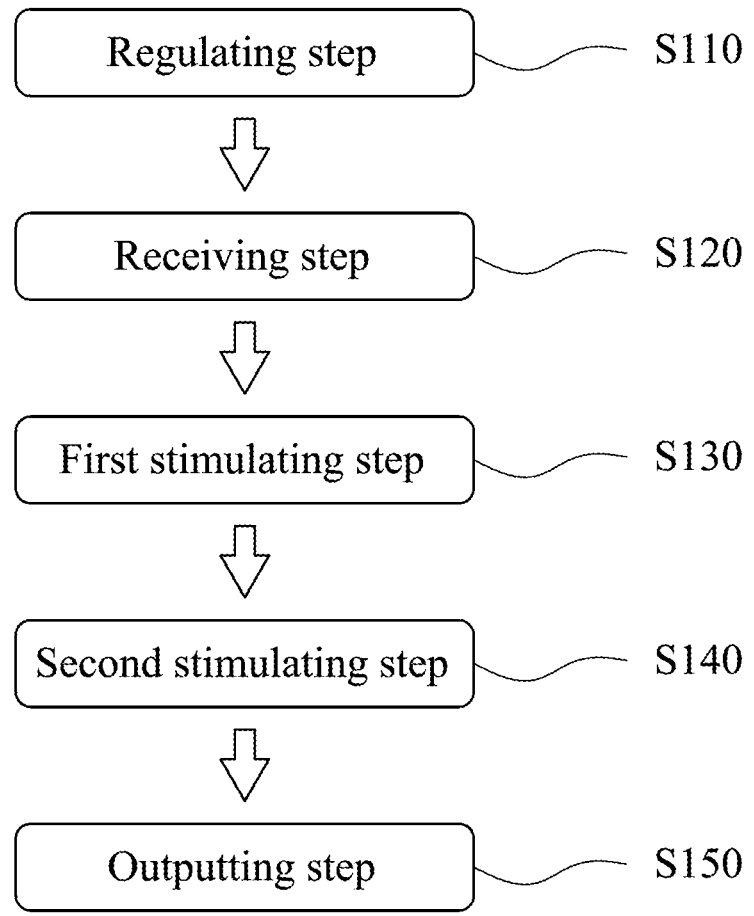
FIG. 11 shows a flow chart of a neuromorphic methodology for switching between the functional operations according to an embodiment of a methodical aspect of the present disclosure.

FIG. 11 shows a flow chart of a neuromorphic methodology S100 for switching between the functional operations according to an embodiment of a methodical aspect of the present disclosure. In FIG. 11, the neuromorphic methodology S100 (i.e., a neuromorphic method) for switching between the functional operations includes a regulating step S110, a receiving step S120, a first stimulating step S130, a second stimulating step S140 and an outputting step S150. The regulating step S110 is performed to drive the controlling unit 200 to regulate the bias currents 230, and the controlling unit 200 includes the first input 210 and the second input 220. The receiving step S120 is performed to provide the neuron unit 300 to receive the bias currents 230, and the neuron unit 300 includes the input neuron group 310, the excitatory neuron group 320, the inhibitory neuron group 330 and the output neuron 340, and the input neuron group 310 receives the first input 210 and the second input 220. The first stimulating step S130 is performed to drive the input neuron group 310 to stimulate the excitatory neuron group 320. The second stimulating step S140 is performed to drive the excitatory neuron group 320 and the inhibitory neuron group 330 to stimulate each other. The outputting step S150 is performed to drive the excitatory neuron group 320 to stimulate the output neuron 340 to generate the output 341. The bias currents 230 control the excitatory neuron group 320, the inhibitory neuron group 330 and the output neuron 340 to be in one of the high-activity state, the middle-activity state and a low-activity state.

Therefore, the neuromorphic methodology S100 for switching between the functional operations of the present disclosure regulates each of the bias currents 230 injected into the neuron unit 300 by the control unit 200, so that the neuron unit 300 is quickly switched between the different functional operations so as to save the power consumption of the neural network computing.

In specific, the voltage difference, the timing difference and the phase difference are generated between the first input 210 and the second input 220, and the first input 210 and the second input 220 are determined to be 0 or 1 according to one of the voltage difference, the timing difference and the phase difference. The output neuron 340 can be controlled by the first bias current 231 of the bias currents 230 to be in one of the high-activity state, the middle-activity state and a low-activity state, and the output 341 is 0 or 1.

Figure 12:
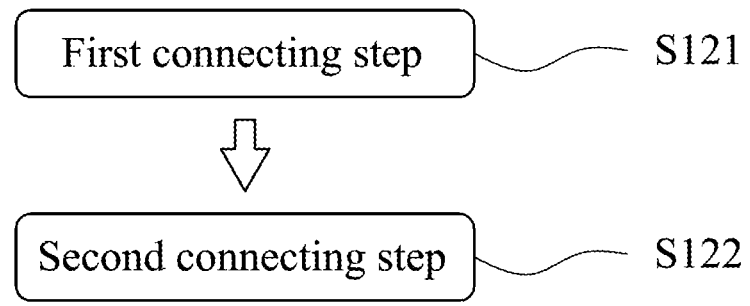
FIG. 12 shows a flow chart of a receiving step of the neuromorphic methodology for switching between the functional operations of FIG. 11.

FIG. 12 shows a flow chart of the receiving step S120 of the neuromorphic methodology S100 for switching between the functional operations of FIG. 11. In FIG. 12, the receiving step S120 can include a first connecting step S121 and a second connecting step S122. The first connecting step S121 is performed to provide the excitatory connections 350. A first one of the excitatory connections 350 is electrically connected between the input neuron group 310 and the excitatory neuron group 320. A second one of the excitatory connections 350 is electrically connected between the excitatory neuron group 320 and the inhibitory neuron group 330. A third one of the excitatory connections 350 is electrically connected between the excitatory neuron group 320 and the output neuron 340, respectively. Each of the excitatory connections 350 is configured to transmit the exciting signal. The second connecting step S122 is performed to drive the inhibitory connections 360 to be electrically connected between the excitatory neuron group 320 and the inhibitory neuron group 330, and each of the inhibitory connections 360 is configured to transmit the inhibiting signal.

Figure 13:
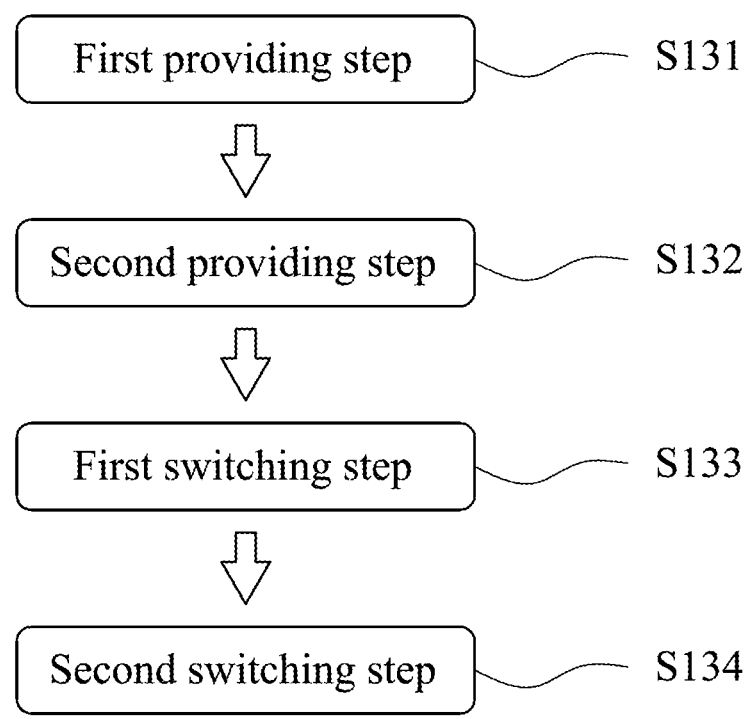
FIG. 13 shows a flow chart of a first stimulating step of the neuromorphic methodology for switching between the functional operations of FIG. 11.

FIG. 13 shows a flow chart of the first stimulating step S130 of the neuromorphic methodology S100 for switching between the functional operations of FIG. 11. In FIG. 13, the first stimulating step S130 can include a first providing step S131 and a second providing step S132. The first providing step S131 is performed to provide the first input neuron 311 to be electrically connected to the control unit 200, and the first input neuron 311 is in either the high-activity state or the low-activity state according to the first input 210. The second providing step S132 is performed to provide the second input neuron 312 to be electrically connected to the control unit 200, and the second input neuron 312 is in either the high-activity state or the low-activity state according to the second input 220.

In addition, the first stimulating step S130 can further include a first switching step S133 and a second switching step S134. The first switching step S133 is performed to drive the first excitatory neuron 321 to be electrically connected to the first input neuron 311, and the first excitatory neuron 321 is controlled to be in one of the high-activity state, the middle-activity state and a low-activity state according to the second bias current 232 of the bias currents 230. The first input neuron 311 stimulates the first excitatory neuron 321 according to the first input 210 to switch the first excitatory neuron 321 to be in one of the high-activity state, the middle-activity state and a low-activity state The second switching step S134 is performed to drive the second excitatory neuron 322 to be electrically connected to the second input neuron 312, and the second excitatory neuron 322 is controlled to be in one of the high-activity state, the middle-activity state and a low-activity state according to the third bias current 233 of the bias currents 230. The second input neuron 312 stimulates the second excitatory neuron 322 according to the second input 220 to switch the second excitatory neuron 322 to be in one of the high-activity state, the middle-activity state and a low-activity state. The first excitatory neuron 321 and the second excitatory neuron 322 stimulate each other.

Figure 14:
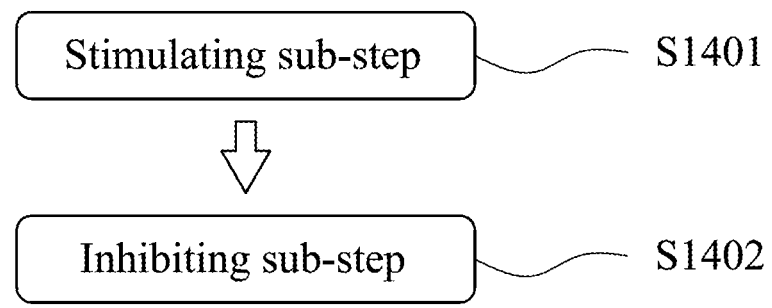
FIG. 14 shows a flow chart of a second stimulating step of the neuromorphic methodology for switching between the functional operations of FIG. 11.

FIG. 14 shows a flow chart of the second stimulating step S140 of the neuromorphic methodology S100 for switching between the functional operations of FIG. 11. In FIG. 14, the second stimulating step S140 can include a stimulating sub-step S1401 and an inhibiting sub-step S1402. The stimulating sub-step S1401 is performed to drive the inhibitory neuron 331 to be electrically connected to the first excitatory neuron 321 and the second excitatory neuron 322, and the inhibitory neuron 331 is controlled to be in one of the high-activity state, the middle-activity state and a low-activity state according to the fourth bias current 234 of the bias currents 230. Both of the first excitatory neuron 321 and the second excitatory neuron 322 stimulate the inhibitory neuron. The inhibiting sub-step S1402 is performed to drive the inhibitory neuron 331 to inhibit the first excitatory neuron 321 and the second excitatory neuron 322 to switch the first excitatory neuron 321 and the second excitatory neuron 322 to be in one of the high-activity state, the middle-activity state and a low-activity state, respectively.

Figure 15:
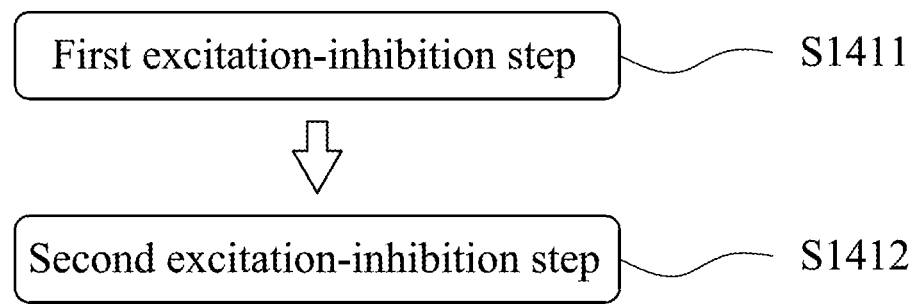
FIG. 15 shows another flow chart of the second stimulating step of the neuromorphic methodology for switching between the functional operations of FIG. 11.

FIG. 15 shows another flow chart of the second stimulating step S140 of the neuromorphic methodology S100 for switching between the functional operations of FIG. 11. In FIG. 15, the second stimulating step S140 can include a first excitation-inhibition step S1411 and a second excitation-inhibition step S1412. The first excitation-inhibition step S1411 is performed to drive the first inhibitory neuron 332 to be electrically connected to the first excitatory neuron 321 and the first input neuron 311, and the first inhibitory neuron 332 is controlled to be in one of the high-activity state, the middle-activity state and a low-activity state according to the fifth bias current 235 of the bias currents 230. The first input neuron 311 stimulates the first inhibitory neuron 332 according to the first input 210, the first excitatory neuron 321 excites the first inhibitory neuron 332, and then the first inhibitory neuron 332 inhibits the first excitatory neuron 321 to switch the first excitatory neuron 321 to be in one of the high-activity state, the middle-activity state and a low-activity state. The second excitation-inhibition step S1412 is performed to drive the second inhibitory neuron 333 to be electrically connected to the second excitatory neuron 322 and the second input neuron 312, and the second inhibitory neuron 333 is controlled to be in one of the high-activity state, the middle-activity state and a low-activity state according to the sixth bias current 236 of the bias currents 230. The second input neuron 312 stimulates the second inhibitory neuron 333 according to the second input 220, the second excitatory neuron 322 excites the second inhibitory neuron 333, and then the second inhibitory neuron 333 inhibits the second excitatory neuron 322 to switch the second excitatory neuron 322 t to be in one of the high-activity state, the middle-activity state and a low-activity state. The first inhibitory neuron 332 and the second inhibitory neuron 333 stimulate each other.

In summary, the present disclosure has the following advantages: First, it is favorable for switching the neural network between the multiple functions by using the control unit to regulate the currents injected into each of the neurons. Second, it is favorable for saving the hardware cost of the neural network. Third, a smaller neural network can be used, and a neural network is no longer necessary to change the connection strength between each of the neural networks. Fourth, the neuromorphic system can also switch between the bistable state, toggling, or central pattern generation.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A neuromorphic system for switching between a multitude of functional operations, comprising:
   a controlling unit providing a first input and a second input and regulating a multitude of bias currents; and a neuron unit electrically connected to the controlling unit and receiving the bias currents, and comprising:
   an input neuron group receiving the first input and the second input;
   an excitatory neuron group electrically connected to the input neuron group and stimulated by the input neuron group;

an inhibitory neuron group electrically connected to the excitatory neuron group, wherein the inhibitory neuron group and the excitatory neuron group stimulate each other; and an output neuron electrically connected to the excitatory neuron group and stimulated by the excitatory neuron group to generate an output;

wherein the bias currents control the excitatory neuron group, the inhibitory neuron group and the output neuron to be in one of a high-activity state, a middle-activity state and a low-activity state in order for the neuron unit to be switched to a particular logical gate function operation of the multitude of functional operations.

2. The neuromorphic system for switching between the functional operations of claim 1, wherein a voltage difference, a timing difference and a phase difference are generated between the first input and the second input, and the first input and the second input are determined to be 0 or 1 according to one of the voltage difference, the timing difference and the phase difference.

3. The neuromorphic system for switching between the functional operations of claim 1, wherein the output neuron is controlled to be in one of the high-activity state, the middle-activity state and the low-activity state according to a first bias current of the bias currents, and the output is 0 or 1.

4. The neuromorphic system for switching between the functional operations of claim 1, wherein the neuron unit further comprises:

a multitude of excitatory connections, wherein a first one of the excitatory connections is electrically connected between the input neuron group and the excitatory neuron group, a second one of the excitatory connections is electrically connected between the excitatory neuron group and the inhibitory neuron group, a third one of the excitatory connections is electrically connected between the excitatory neuron group and the output neuron, and each of the excitatory connections is configured to transmit an exciting signal; and a multitude of inhibitory connections electrically connected between the excitatory neuron group and the inhibitory neuron group, wherein each of the inhibitory connections is configured to transmit an inhibiting signal.

5. The neuromorphic system for switching between the functional operations of claim 1, wherein, the input neuron group comprising:

a first input neuron electrically connected to the controlling unit and in either the high-activity state or the low-activity state according to the first input; and a second input neuron electrically connected to the controlling unit and in either the high-activity state or the low-activity state according to the second input; and the excitatory neuron group comprising:

a first excitatory neuron electrically connected to the first input neuron and controlled to be in one of the high-activity state, the middle-activity state and the low-activity state according to a second bias current of the bias currents, wherein the first input neuron stimulates the first excitatory neuron according to the first input to switch the first excitatory neuron to be in one of the high-activity state, the middle-activity state and the low-activity state; and a second excitatory neuron electrically connected to the second input neuron and controlled to be in one of the high-activity state, the middle-activity state and the low-activity state according to a third bias current of the bias currents, wherein the second input neuron stimulates the second excitatory neuron according to the second input to switch the second excitatory neuron to be in one of the high-activity state, the middle-activity state and the low-activity state;

wherein the first excitatory neuron and the second excitatory neuron stimulate each other.

6. The neuromorphic system for switching between the functional operations of claim 5, wherein the inhibitory neuron group comprises:

an inhibitory neuron electrically connected to the first excitatory neuron and the second excitatory neuron and controlled to be in one of the high-activity state, the middle-activity state and the low-activity state according to a fourth bias current of the bias currents, wherein the first excitatory neuron, the second excitatory neuron and the inhibitory neuron stimulate each other to switch the first excitatory neuron and the second excitatory neuron to be in one of the high-activity state, the middle-activity state and the low-activity state, respectively.

7. The neuromorphic system for switching between the functional operations of claim 5, wherein the inhibitory neuron group comprises:

a first inhibitory neuron electrically connected to the first excitatory neuron and the first input neuron and controlled to be in one of the high-activity state, the middle-activity state and the low-activity state according to a fifth bias current of the bias currents, wherein the first input neuron stimulates the first inhibitory neuron according to the first input, and the first excitatory neuron and the first inhibitory neuron stimulate each other to switch the first excitatory neuron to be in one of the high-activity state, the middle-activity state and the low-activity state; and a second inhibitory neuron electrically connected to the second excitatory neuron and the second input neuron and controlled to be in one of the high-activity state, the middle-activity state and the low-activity state according to a sixth bias current of the bias currents, wherein the second input neuron stimulates the second inhibitory neuron according to the second input, and the second excitatory neuron and the second inhibitory neuron stimulate each other to switch the second excitatory neuron to be in one of the high-activity state, the middle-activity state and the low-activity state;

wherein the first inhibitory neuron and the second inhibitory neuron stimulate each other.

8. A neuromorphic methodology for switching between a multitude of functional operations, comprising:

performing a regulating step to drive a controlling unit to regulate a multitude of bias currents, wherein the controlling unit comprises a first input and a second input;

performing a receiving step to provide a neuron unit to receive the bias currents, wherein the neuron unit comprises an input neuron group, an excitatory neuron group, an inhibitory neuron group and an output neuron, and the input neuron group receives the first input and the second input;

performing a first stimulating step to drive the input neuron group to stimulate the excitatory neuron group;

performing a second stimulating step to drive the excitatory neuron group and the inhibitory neuron group to stimulate each other; and performing an outputting step to drive the excitatory neuron group to stimulate the output neuron to generate an output;

wherein the bias currents control the excitatory neuron group, the inhibitory neuron group and the output neuron to be in one of a high-activity state, a middle-activity state and a low-activity state in order for the neuron unit to be switched to a particular logical gate function operation of the multitude of functional operations.

9. The neuromorphic methodology for switching between the functional operations of claim 8, wherein a voltage difference, a time difference and a phase difference are generated between the first input and the second input, and the first input and the second input are determined to be 0 or 1 according to one of the voltage difference, the timing difference and the phase difference.

10. The neuromorphic methodology for switching between the functional operations of claim 8, wherein the output neuron is controlled to be in one of the high-activity state, the middle-activity state and the low-activity state according to a first bias current of the bias currents, and the output is 0 or 1.

11. The neuromorphic methodology for switching between the functional operations of claim 8, wherein the receiving step comprises:

performing a first connecting step to provide a multitude of excitatory connections, wherein a first one of the excitatory connections is electrically connected between the input neuron group and the excitatory neuron group, a second one of the excitatory connections is electrically connected between the excitatory neuron group and the inhibitory neuron group, a third one of the excitatory connections is electrically connected between the excitatory neuron group and the output neuron, respectively, and each of the excitatory connections is configured to transmit an exciting signal; and performing a second connecting step to drive a multitude of inhibitory connections to be electrically connected between the excitatory neuron group and the inhibitory neuron group, wherein each of the inhibitory connections is configured to transmit an inhibiting signal.

12. The neuromorphic methodology for switching between the functional operations of claim 8, wherein the first stimulating step comprises:

performing a first providing step to provide a first input neuron to be electrically connected to the control unit, wherein the first input neuron is in either the high-activity state or the low-activity state according to the first input; and performing a second providing step to provide a second input neuron to be electrically connected to the control unit, wherein the second input neuron is in either the high-activity state or the low-activity state according to the second input.

13. The neuromorphic methodology for switching between the functional operations of claim 12, wherein the first stimulating step comprises:

performing a first switching step to drive a first excitatory neuron to be electrically connected to the first input neuron, wherein the first excitatory neuron is controlled to be in one of the high-activity state, the middle-activity state and the low-activity state according to a second bias current of the bias currents, and the first input neuron stimulates the first excitatory neuron according to the first input to switch the first excitatory neuron to be in one of the high-activity state, the middle-activity state and the low-activity state; and performing a second switching step to drive a second excitatory neuron to be electrically connected to the second input neuron, wherein the second excitatory neuron is controlled to be in one of the high-activity state, the middle-activity state and the low-activity state according to a third bias current of the bias currents, and the second input neuron stimulates the second excitatory neuron according to the second input to switch the second excitatory neuron to be in one of the high-activity state, the middle-activity state and the low-activity state;

wherein the first excitatory neuron and the second excitatory neuron stimulate each other.

14. The neuromorphic methodology for switching between the functional operations of claim 13, wherein the second stimulating step comprises:

performing a stimulating sub-step to drive an inhibitory neuron to be electrically connected to the first excitatory neuron and the second excitatory neuron, wherein the inhibitory neuron is controlled to be in one of the high-activity state, the middle-activity state and the low-activity state according to a fourth bias current of the bias currents, and the first excitatory neuron and the second excitatory neuron stimulate the inhibitory neuron, respectively; and performing an inhibiting sub-step to drive the inhibitory neuron to inhibit the first excitatory neuron and the second excitatory neuron to switch the first excitatory neuron and the second excitatory neuron to be in one of the high-activity state, the middle-activity state and the low-activity state, respectively.

15. The neuromorphic methodology for switching between the functional operations of claim 13, wherein the second stimulating step comprises:

performing a first excitation-inhibition step to drive a first inhibitory neuron to be electrically connected to the first excitatory neuron and the first input neuron, wherein the first inhibitory neuron is controlled to be in one of the high-activity state, the middle-activity state and the low-activity state according to a fifth bias current of the bias currents, the first input neuron stimulates the first inhibitory neuron according to the first input, the first excitatory neuron excites the first inhibitory neuron, and the first inhibitory neuron inhibits the first excitatory neuron to switch the first excitatory neuron to be in one of the high-activity state, the middle-activity state and the low-activity state; and performing a second excitation-inhibition step to drive a second inhibitory neuron to be electrically connected to the second excitatory neuron and the second input neuron, wherein the second inhibitory neuron is controlled to be in one of the high-activity state, the middle-activity state and the low-activity state according to a sixth bias current of the bias currents, the second input neuron stimulates the second inhibitory neuron according to the second input, the second excitatory neuron excites the second inhibitory neuron, and the second inhibitory neuron inhibits the second excitatory neuron to switch the second excitatory neuron to be in one of the high-activity state, the middle-activity state and the low-activity state;

wherein the first inhibitory neuron and the second inhibitory neuron stimulate each other.

* * * * *